United States Patent [19]

Gersbach

[11] Patent Number: 5,598,313
[45] Date of Patent: Jan. 28, 1997

[54] ELECTROSTATIC DISCHARGE SUPPRESSION CIRCUIT FOR INTEGRATED CIRCUIT CHIPS

[75] Inventor: John E. Gersbach, Burlington, Vt.

[73] Assignee: International Business Machines Corporation, Armonk, N.Y.

[21] Appl. No.: 363,135

[22] Filed: Dec. 23, 1994

[51] Int. Cl.[6] .................................................. H02H 9/00
[52] U.S. Cl. ............................. 361/56; 361/91; 361/111
[58] Field of Search ............................... 361/56, 91, 111, 361/118, 119

[56] References Cited

U.S. PATENT DOCUMENTS

| | | | |
|---|---|---|---|
| 4,423,431 | 12/1983 | Sasaki | 357/41 |
| 5,208,719 | 5/1993 | Wei | 361/56 |
| 5,239,440 | 8/1993 | Merrill | 361/91 |
| 5,243,490 | 9/1993 | Ontko et al. | 361/91 |
| 5,311,391 | 5/1994 | Dungan et al. | 361/56 |
| 5,319,259 | 6/1994 | Merrill | 361/443 |
| 5,400,202 | 3/1995 | Metz et al. | 361/56 |

*Primary Examiner*—Jeffrey A. Gaffin
*Assistant Examiner*—Stephen Jackson
*Attorney, Agent, or Firm*—Heslin & Rothenberg, P.C.

[57] ABSTRACT

An electrostatic discharge suppression circuit is presented for an integrated circuit chip intended for subsequent functioning within a multi-level power supply environment. The suppression circuit includes a clamping circuit, discharge means and a trigger circuit. The clamping circuit shunts an electrostatic discharge at an input and/or output node of the integrated circuit chip to a common node of the suppression circuit. The discharge means is coupled to the common node for dissipating the electrostatic discharge shunted thereto. The trigger circuit is connected to both the common node and the discharge means and includes regenerative feedback for fast turn on of the discharge means as the electrostatic discharge is shunted to the common node such that damage to the integrated circuit chip due to the electrostatic discharge is prevented. An inhibit circuit is coupled to the discharge means for selective inhibiting of the discharge means in response to an inhibit protection signal.

15 Claims, 3 Drawing Sheets

5,598,313

ELECTROSTATIC DISCHARGE SUPPRESSION CIRCUIT FOR INTEGRATED CIRCUIT CHIPS

TECHNICAL FIELD

This invention relates in general to protection of integrated circuit chips, and more particularly, to a suppression circuit for protecting integrated circuit chips from electrostatic discharges or other potentially damaging voltage transients occurring prior to mounting thereof onto a circuit card.

BACKGROUND ART

Electrostatic discharge (ESD) is a phenomenon known to degrade or destroy electronic components. In particular, given the decreasing size of circuit features with ever improving process technology, static electricity can destroy or substantially harm many of today's integrated circuits. Electrostatic discharge can occur, for example, from human handling, automated circuit testing or as a packaged circuit slides on its pins across another surface. The circuits most susceptible to damage are unpackaged or packaged finished circuits which have not yet been installed into a finished product. Once installed, for example, onto a circuit card, other means exist to protect the circuits from damage.

Various techniques have been employed to protect integrated circuit chips handled by humans during the fabrication process. These methods include special handling procedures, use of grounding equipment, and the addition of protective components to the chip circuitry. The most popular technique used to protect complementary metal-oxide semiconductor (CMOS) circuits from ESD is the addition of diffused or implanted dual clamping diodes to clamp input and/or output voltages to within the boundaries of the chip's power supply connections. Such dual diodes are coupled between the input paths of the circuit and the pins to which the power supplies are connected. With an electrostatic discharge event of one polarity, a first diode is forward-biased and with a discharge of the opposite polarity, the second diode is forward-biased. Other methods used for protecting CMOS circuits from electrostatic discharge damage are almost always variations on this dual diode clamping approach.

The ESD dissipation methods described above typically function satisfactorily for integrated circuits with large features. However, as the features of integrated circuits approach one micron and smaller, lower voltages than those which damage the larger feature circuits can destroy these more sensitive circuits. Many integrated circuit cards today comprise hybrid cards wherein the normal signal voltages of a chip must often be allowed to exceed normal power supply voltage levels. This is commonly the situation where a CMOS chip powered at 3.3 volts shares an interface bus with older technology integrated circuit chips powered at 5 volts. In such a case, the conventional dual diode protection method described above is unworkable since in operation the power supply connections would restrict voltage on the input and/or output nodes of the CMOS chip.

Thus, there exists a need in the integrated circuit art for a novel ESD suppression circuit for protecting packaged and unpackaged integrated circuit chips which acknowledges the integrated circuit chips' full functionality in subsequently established multi-level power supply environments.

DISCLOSURE OF INVENTION

Briefly summarized, the present invention comprises in one aspect a suppression circuit for dissipating an electrostatic discharge at an input and/or output node of an integrated circuit. The suppression circuit includes a clamping circuit, discharge means and a trigger circuit. The clamping circuit shunts the electrostatic discharge at the input and/or output node to a common node, and the discharge means is coupled to the common node for dissipating the electrostatic discharge shunted thereto. The trigger circuit is connected to both the common node and the discharge means and includes regenerative feedback for fast turn on of the discharge means as the electrostatic discharge is shunted to the common node such that damage to the integrated circuit due to the electrostatic discharge is prevented. As an enhancement, this aspect of the invention can be combined with an inhibit means coupled to the discharge means for selective inhibiting of the discharge means. The inhibit means allows for rendering the suppression circuit inoperative once the integrated circuit is mounted onto a circuit card for normal operation.

In another aspect, the invention is characterized as a suppression circuit for selectively suppressing a power transient at an input and/or output node of an integrated circuit. This suppression circuit includes a clamping circuit for shunting the power transient at the input and/or output node to a common node and a discharge means coupled to the common node for dissipating the power transient shunted thereto. An inhibit means is coupled to the discharge means for selective inhibiting of the discharge means' dissipating of the power transient at the common node, thereby providing selective suppression of the power transient at the input and/or output node of the integrated circuit.

In a further aspect, the invention comprises an integrated circuit chip having an integrated circuit and multiple input and/or output pads coupled thereto. The integrated circuit chip further includes an electrostatic discharge suppression circuit electrically coupled to the multiple input and/or output pads. The electrostatic discharge suppression circuit includes a clamping circuit, discharge means and a trigger circuit. The clamping circuit shunts an electrostatic discharge at one of the multiple input and/or output pads to a common node, while the discharge means is coupled to the common node for dissipating the electrostatic discharge shunted thereto. The trigger circuit is connected to both the common node and the discharge means and includes regenerative feedback for fast turn on of the discharge means as the electrostatic discharge is shunted to the common node, thereby preventing damage to the integrated circuit due to the electrostatic discharge.

Additional aspects of the invention are also presented and claimed herein. To restate, this invention comprises in all aspects a suppression circuit for an integrated circuit chip able to provide protection against electrostatic discharges or potentially damaging voltage transients occurring at an input, output, or power supply pad of an integrated circuit chip intended for subsequent functioning within a multi-level power supply environment. The suppression circuit is active/inactive programmable for dissipating power transients during the fabrication, testing and assembly processes, without subsequently degrading performance of the integrated circuit chip once mounted onto a circuit card. Further, should the chip subsequently be disconnected from the circuit card, the suppression circuit automatically reasserts itself for protecting the chip from potentially damaging power transients at one or more input and/or output pad. The novel suppression circuit includes a trigger circuit connected in a regenerative, positive feedback configuration for fast turn on of a discharge transistor, thereby preventing damage to the associated integrated circuit chip. Electrostatic discharge protection is provided both in positive and negative polarity directions.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which.

BEST MODE FOR CARRYING OUT THE INVENTION

Figure 1:
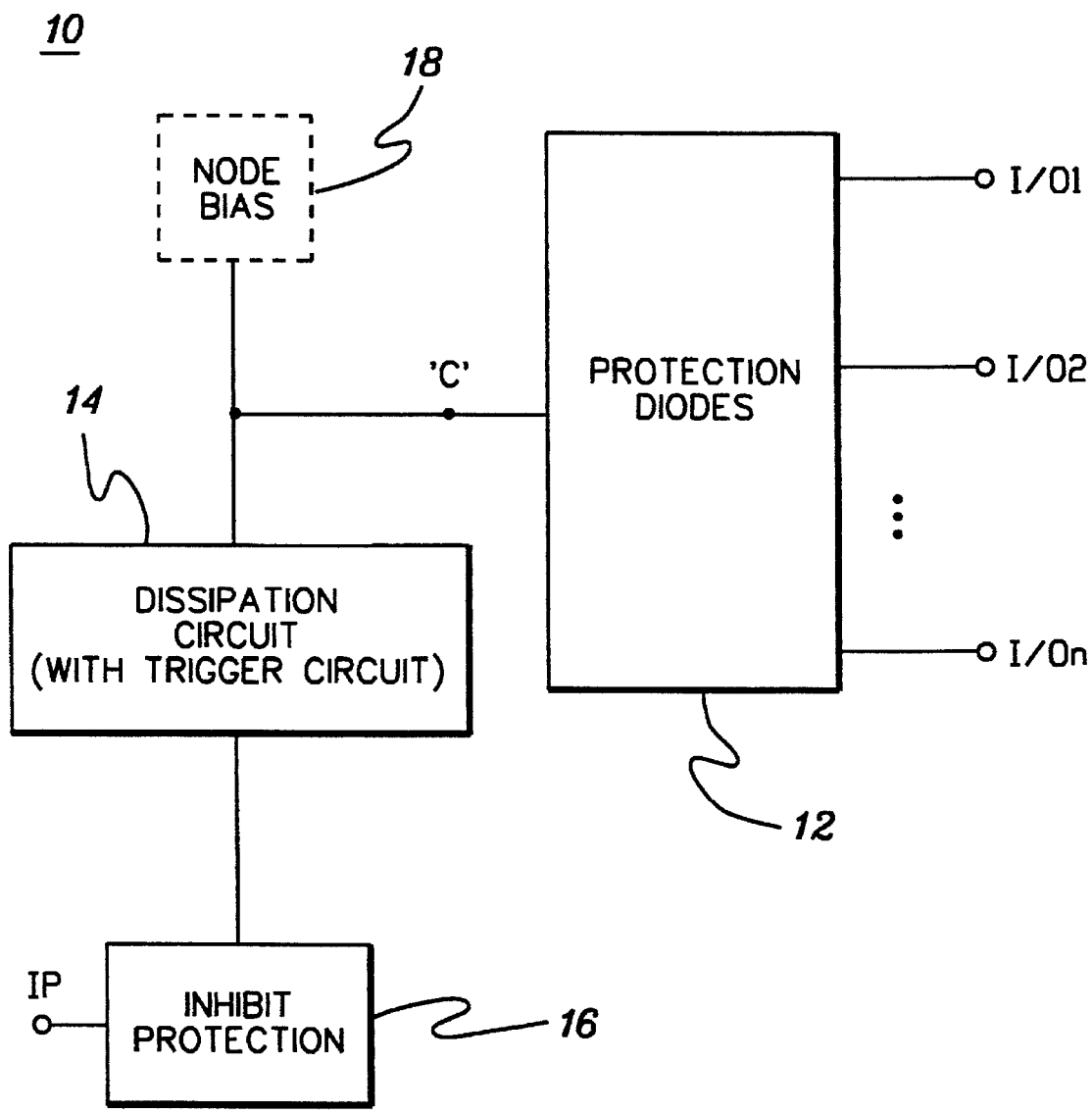
FIG. 1 is a block diagram of an ESD suppression circuit in accordance with the present invention.

FIG. 1 presents a block diagram of a suppression circuit, generally denoted 10, in accordance with the present invention. Circuit 10 includes protection diodes 12 electrically connected to multiple input pads, output pads or input/output pads I/O1, I/O2, ..., I/On (herein referred to as input and/or output pads). These pads may comprise signal pads, control pads, power supply pads, etc. As explained further below, protection diodes 12 are configured to shunt an electrostatic discharge or other spurious voltage spike on an input and/or output pad of the integrated circuit to a common node 'C' of the suppression circuit. The voltage transient (dV/dt) from shunting of the electrostatic discharge to common node 'C' activates one or more wide width transistors in a dissipation circuit 14 to dissipate the spurious signal. Fast turn on of the dissipation transistors is ensured by use of a trigger circuit connected between common node 'C' and the control gate of the wide width transistor(s).

An inhibit protection circuit 16 is also coupled to the control gate of the dissipation transistor(s) for selective inhibiting of the operation of the suppression circuit, specifically after the associated integrated circuit (not shown) has been packaged and assembled onto a higher level circuit card. Inhibit protection circuit 16 is configured such that application of an appropriate control signal at an 'IP' input will result in disabling of dissipation circuit 14. This feature is significant since in accordance with the present invention the associated integrated circuit is to be employed in an environment where at least some of the input and/or output pads may interface with multi-level power supply signals, e.g., 3.3 volts and 5 volts. As explained below, for enhanced performance common node 'C' is preferably biased by a node bias circuit 18. Without biasing of common node 'C' to some positive voltage level, performance of the associated integrated circuit might be degraded due to the extra time required to develop a corresponding signal at node 'C' upon application of a positive signal to one of the input and/or output nodes of the circuit.

Figure 2:
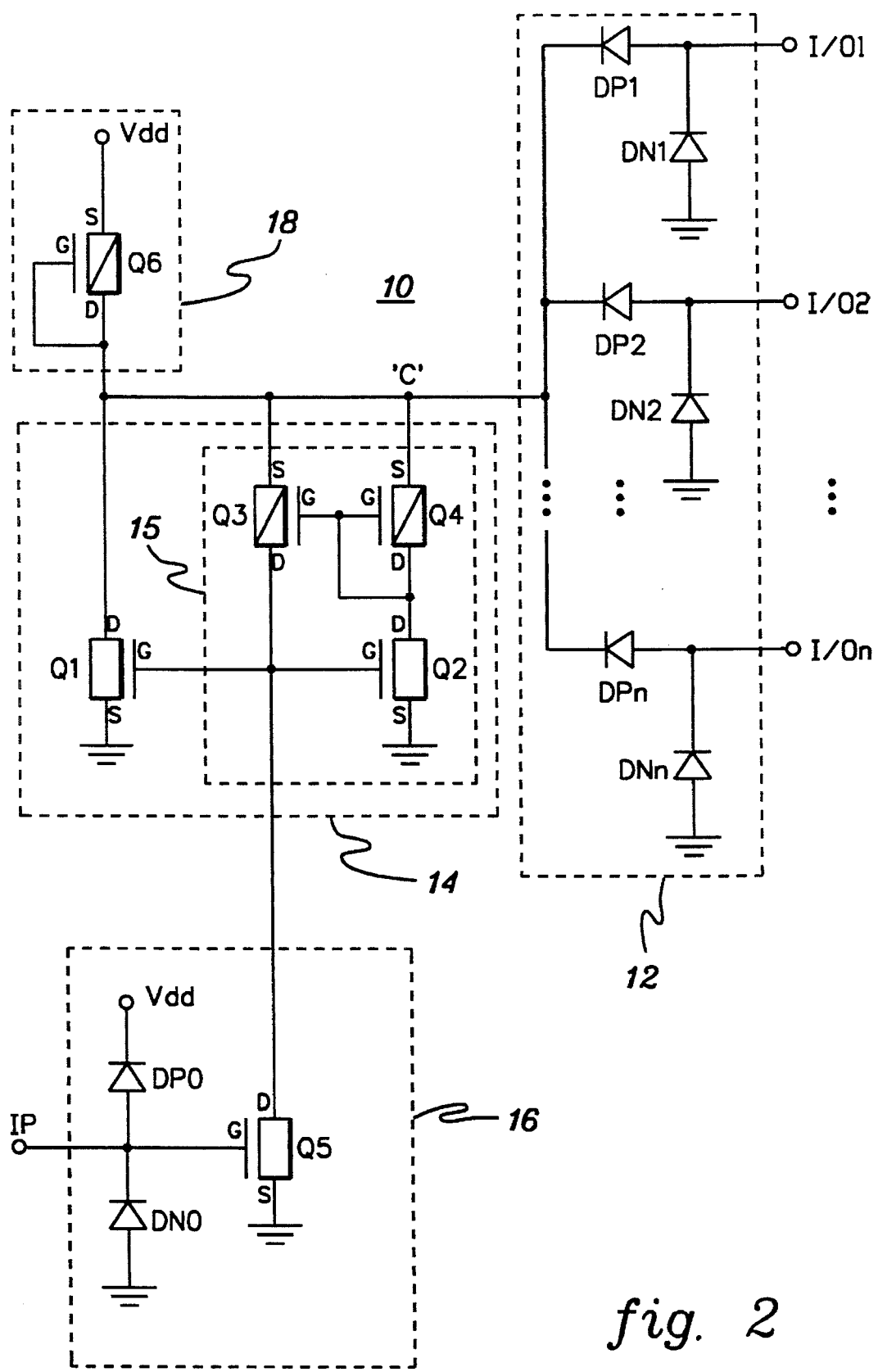
FIG. 2 is a schematic of one detailed embodiment of the ESD suppression circuit of FIG. 1.

One detailed embodiment of a suppression circuit 10 in accordance with the present invention is depicted in FIG. 2, wherein complementary metal-oxide semiconductor (CMOS) circuits with P-channel field-effect transistors (PFETs) are indicated by a rectangle with a diagonal line formed therein and a control element or gate electrode arranged adjacent thereto and N-channel field-effect transistors (NFETs) are depicted as a rectangle without a diagonal line and with a control element or gate electrode arranged adjacent thereto.

As shown, the plurality of input and/or output pads I/O1, I/O2, ..., I/On of the associated integrated circuit, or integrated circuit chip, are connected to a plurality of diode pairs (DP1, DN1; DP2, DN2; ... DPn, DNn within protection diodes circuit 12. Diodes DP1, DP2, ... DPn operate as positive clamps to shunt a positive power transition at an input and/or output node to common node 'C' of the suppression circuit, while protection against negative electrostatic discharge voltages is provided by diodes DN1, DN2, ... DNn connected to ground.

In this embodiment, dissipation circuit 14 is shown to include a single dissipation transistor Q1 which would comprise a very wide N-channel field-effect transistor (NFET) to ensure that the transistor is capable of carrying the large currents, e.g., 1 ampere or greater, that can result from an ESD transient or other voltage spike. A trigger circuit 15, coupled between the control gate 'G' of NFET Q1 and the common node 'C' is connected in a regenerative, positive feedback configuration so that when conduction begins in either PFET Q3 or NFET Q2, the other transistor is driven to conduction, thereby reinforcing the drive on of the first and on NFET Q1. P-channel field-effect transistors (PFETs) Q3 & Q4 are connected as a current mirror wherein current flow through transistor Q4 is mirrored to transistor Q3.

Operationally, when a positive electrostatic discharge voltage is applied to any input and/or output pad of the associated integrated circuit (or, more specifically, between any two input and/or output pads), there is a fast voltage change (dV/dt) which is coupled through the corresponding positive clamp diode DP1, DP2, ..., DPn, to common node 'C'. Since dissipation transistor Q1 is very wide, it has a large drain to gate capacitance which serves to couple the transient voltage to gates 'G' of Q1 and Q2, turning the transistors on. Transistor Q2 then turns on transistor Q3 starting the regenerative action which locks the circuit on until the ESD transient has been dissipated through transistor Q1. Transistor Q4 serves to soften the gain of transistor Q3 to prevent spurious triggering of the circuit during normal operation.

As another feature of this suppression circuit, inhibit protection circuit 16 provides a controllability characteristic to the dissipation function of transistor Q1. Circuit 16 is connected to the gates 'G' of transistors Q1 & Q2. In this embodiment, inhibit protection is attained via an NFET Q5 which has a grounded source 'S' and a drain 'D' connected to the gates 'G' of transistors Q1 & Q2. The control gate of transistor Q5 is coupled to input node 'IP'. Through inhibit protection circuit 16, the dissipation function of suppression circuit 10 can be disabled, i.e., for normal operation of the integrated circuit chip, by connecting input 'IP' to a positive power supply Vdd via a separate chip pad and module pin as the packaged integrated circuit is finally mounted onto the circuit card. Thus, although the suppression circuit remains on chip, the circuit may be readily disabled once the chip has been installed onto a circuit board. Prior to this point, input IP has no source of positive drive and remains below the threshold voltage of transistor Q5. Inhibit protection circuit 16 also includes a conventional electrostatic discharge, dual diode protection feature, i.e., positive diode DP0 connected to supply Vdd and negative diode DN0 connected to ground.

Node bias circuit 18 comprises a PFET Q6 connected in diode configuration with its gate 'G' connected to its drain 'D' at common node 'C' and its source 'S' coupled to circuit supply voltage Vdd. By way of example, in a 3.3 volt power supply technology, node bias circuit 18 will maintain node 'C' at approximately 2.6 volts so that during normal operation, application of, for example, a 5 volt signal to an input and/or output pad I/O1, I/O2 . . . , I/On would result in node 'C' rising from 2.6 volts to 4.3 volts. Thus, superior signal transfer characteristics are attained in comparison with a rise differential of, for example, 4.3 volts should node 'C' not be biased.

Figure 3:
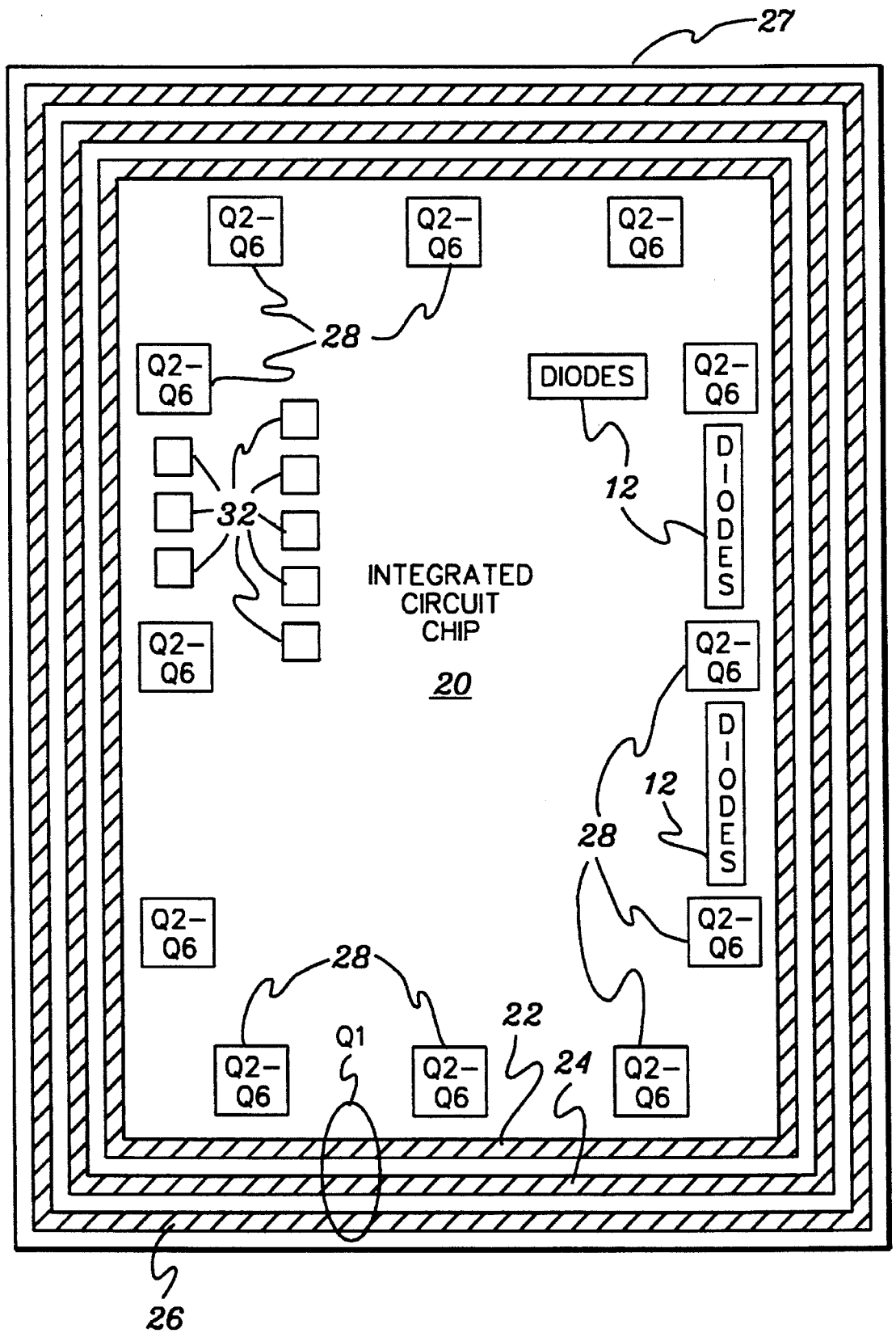
FIG. 3 is a plan view of one embodiment of an integrated circuit chip implementing an ESD suppression circuit in accordance with the present invention.

FIG. 3 presents one layout configuration of a suppression circuit in accordance with the present invention on an integrated circuit chip 20. As shown, dissipation transistor Q1 may comprise a continuous, multi-stripe device disposed along the periphery 27 of integrated circuit chip 20. Alternatively, multiple such dissipation transistors Q1 could be disposed adjacent to each other along the periphery. In this regard, note that FIG. 3 is not drawn to scale. Dissipation transistor Q1 comprises a drain diffusion, with a metal contact 22 thereto, which extends to the edge of a polysilicon implemented gate 24. A metal contact 26 connects to the source diffusion of transistor Q1. This contact may also serve as a substrate ground connection.

Transistor Q1 is shown to comprise a single poly stripe 24 but if desired could be implemented as multiple transistors having multiple gate controls. Further, numerous variations on the configuration of dissipation transistor Q1 are possible. In any configuration, a basic requirement is that the transistor be sized sufficiently to handle dissipation of an anticipated electrostatic discharge occurring on one or more of the input and/or output nodes of the integrated circuit chip.

By way of example, several input and/or output nodes 32 are shown in FIG. 3. Nodes 32 can be disposed anywhere across the surface of the integrated circuit chip, including above dissipation transistor Q1 at a higher metallization level. Due to the wide width of transistor Q1, the remaining circuits 28 (Q2-Q6) of suppression circuit 10 are preferably repeated, and connected in parallel, a number of times across the integrated circuit chip. Otherwise, the electrode resistance of transistor Q1 would become significant. The diodes of suppression circuit 10 are similarly repeated a number of times across the integrated circuit chip. Protection diodes 12 may be randomly placed about the edge of the integrated circuit chip.

To restate, this invention comprises in all aspects a suppression circuit for an integrated circuit chip able to provide protection against electrostatic discharges or potentially damaging voltage transients occurring at an input and/or output pad of an integrated circuit chip intended for subsequent functioning within a multi-level power supply environment. The suppression circuit is active/inactive programmable for dissipating power transients during the fabrication, testing and assembly processes, without subsequently degrading performance of the integrated circuit chip once mounted onto a circuit card. Further, should the chip subsequently be disconnected from the circuit card, the suppression circuit automatically reasserts itself for protecting the chip from a potentially damaging power transient at one or more input and/or output pad. The novel suppression circuit includes a trigger circuit connected in a regenerative, positive feedback configuration for fast turn on of a discharge transistor, thereby preventing damage to the associated integrated circuit chip. Electrostatic discharge protection is provided both in positive and negative polarity directions.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

I claim:

1. An integrated circuit chip comprising:

an integrated circuit;

multiple input and/or output pads coupled to the integrated circuit for external connection thereto; and an electrostatic discharge (ESD) suppression circuit electrically coupled to said multiple input and/or output pads, said electrostatic discharge suppression circuit comprising a clamping circuit for shunting an electrostatic discharge at one of said multiple input and/or output pads to a common node, discharge means coupled to the common node for dissipating the electrostatic discharge shunted thereto, and a trigger circuit connected to the common node and to the discharge means, the trigger circuit including regenerative feedback for fast turn on of the discharge means as the electrostatic discharge is shunted to the common node, thereby preventing damage to the integrated circuit due to said electrostatic discharge, and inhibit means coupled to the discharge means for selective inhibiting of the discharge means to render the ESD suppression circuit inoperative when the integrated circuit chip is in normal operation, said inhibit means having a control input, said control input being electrically isolated from said integrated circuit and any signal supplied thereto when said ESD suppression circuit is operative.

2. The integrated circuit chip of claim 1, wherein said discharge means comprises as least one wide width transistor, said at least one wide width transistor residing adjacent to a periphery of said integrated circuit chip.

3. An integrated circuit chip comprising:

an integrated circuit;

multiple input and/or output pads coupled to the integrated circuit for external connection thereto; and a power transient suppression circuit electrically coupled to said multiple input and/or output pads, said power transient suppression circuit comprising a clamping circuit for shunting a power transient at one of said multiple input and/or output pads to a common node, discharge means coupled to the common node for dissipating the power transient shunted thereto, and inhibit means coupled to the discharge means for selective inhibiting of the discharge means' dissipating of the power transient at the common node, thereby providing selective suppression of the power transient at the input and/or output node of the integrated circuit, said inhibit means having a control input, said control input being electrically isolated from said integrated circuit and any signal supplied thereto when said discharge means' dissipating of the power transient at the common node is uninhibited by said inhibit means.

4. The integrated circuit chip of claim 3, wherein said discharge means comprises at least one transistor, each transistor having a control gate, and wherein said inhibit means is connected to each control gate for selectively inhibiting development of a transistor 'on' signal thereat.

5. A suppression circuit for selectively suppressing a power transient at an input and/or output node of an integrated circuit, said suppression circuit comprising:

a clamping circuit for shunting the power transient at the input and/or output node to a common node;

discharge means coupled to the common node for dissipating the power transient shunted thereto; and inhibit means coupled to the discharge means for selective inhibiting of the discharge means' dissipating of the power transient at the common node, thereby providing selective suppression of the power transient at the input and/or 11 output node of the integrated circuit, said inhibit means having a control input, said control input being electrically isolated from said integrated circuit and any signal supplied thereto when said discharge means' dissipating of the power transient at the common node is uninhibited by said inhibit means.

6. The suppression circuit of claim 5, wherein said discharge means comprises at least one transistor, each transistor having a control gate, and wherein said inhibit means is connected to each control gate for selectively inhibiting development of a signal thereat.

7. The suppression circuit of claim 6, wherein said inhibit means comprises a field-effect transistor having a gate comprising said control input, and one of a source and a drain connected to each control gate of said at least one transistor.

8. The suppression circuit of claim 7, further comprising a trigger circuit connected to the common node and to the discharge means, said trigger circuit including regenerative feedback for fast turn on of the discharge means as the power transient is shunted to the common node, thereby preventing damage to the integrated circuit due to the power transient.

9. A suppression circuit for dissipating an electrostatic discharge at an input and/or output node of an integrated circuit, said suppression circuit comprising:

a clamping circuit for shunting the electrostatic discharge at the input and/or output node to a common node;

discharge means coupled to the common node for dissipating the electrostatic discharge shunted thereto;

a trigger circuit connected to the common node and the discharge means, said trigger circuit including regenerative feedback for fast turn on of the discharge means as the electrostatic discharge is shunted to the common node, thereby preventing damage to the integrated circuit due to said electrostatic discharge; and inhibit means coupled to the discharge means for selective inhibiting of the discharge means to render said suppression circuit inoperative when the integrated circuit is in normal operation, said inhibit means having a control input, said control input being electrically isolated from said integrated circuit and any signal supplied thereto when said suppression circuit is operative.

10. The suppression circuit of claim 1, wherein said discharge means comprises a transistor having a control gate, and wherein said inhibit means is connected to said control gate for inhibiting development of a signal thereat.

11. The suppression circuit of claim 9, wherein said clamping circuit includes means for shunting a negative electrostatic discharge at the input and/or output node to ground potential, and means for shunting a positive electrostatic discharge at the input and/or output node to the common node, said means for shunting the positive electrostatic discharge comprising a P-type diode connected between the input and/or output node and the common node.

12. The suppression circuit of claim 9, further comprising means for biasing the common node to a positive voltage level to thereby limit performance degradation by the suppression circuit on the integrated circuit during normal operation.

13. The suppression circuit of claim 9, wherein said integrated circuit includes multiple input and/or output nodes, said suppression circuit being coupled to each of said multiple input and/or output nodes, and wherein said clamping circuit includes means for shunting an electrostatic discharge at any one of the input and/or output nodes to the common node.

14. The suppression circuit of claim 9, wherein said discharge means comprises a wide width transistor, and wherein said trigger circuit is connected to a gate of said wide width transistor.

15. The suppression circuit of claim 14, wherein said electrostatic discharge comprises a positive electrostatic discharge and wherein said wide width transistor comprises an N-channel field-effect transistor (NFET) having a drain connected to the common node and a source connected to ground potential.

\* \* \* \* \*

UNITED STATES PATENT AND TRADEMARK OFFICE
CERTIFICATE OF CORRECTION

PATENT NO. : 5,598,313

DATED : Jan. 28, 1997

INVENTOR(S) : John E. Gersbach

It is certified that error appears in the above-identified patent and that said Letters Patent are hereby corrected as shown below:

Col. 7, line 12, claim 5,     "and/or 11 output" should be --and/or output--.

Col. 8, line 10, claim 10,    "claim 1" should be --claim 9--.

Signed and Sealed this

Twentieth Day of May, 1997

Attest:

BRUCE LEHMAN

*Attesting Officer*     *Commissioner of Patents and Trademarks*